United States Patent
Tsuno

(10) Patent No.: US 6,495,826 B2
(45) Date of Patent: Dec. 17, 2002

(54) MONOCHROMETER FOR ELECTRON BEAM

(75) Inventor: Katsushige Tsuno, Tokyo (JP)

(73) Assignee: JEOL, Ltd., Tokyo (JP)

(*) Notice: Subject to any disclaimer, the term of this patent is extended or adjusted under 35 U.S.C. 154(b) by 0 days.

(21) Appl. No.: 09/832,298

(22) Filed: Apr. 10, 2001

(65) Prior Publication Data

US 2001/0052744 A1 Dec. 20, 2001

(30) Foreign Application Priority Data

Apr. 10, 2000 (JP) .............................. 2000-107624

(51) Int. Cl.[7] .............................................. H01J 49/48
(52) U.S. Cl. ........................ 250/305; 250/306; 250/307; 250/309; 250/310; 250/311; 250/396 R; 250/397; 250/398
(58) Field of Search ........................ 250/305, 306–311, 250/313, 396 R–398

(56) References Cited

U.S. PATENT DOCUMENTS 4,851,670 A * 7/1989 Krivanek ..................... 250/305
5,798,524 A * 8/1998 Kundmann et al. ......... 250/305
5,838,004 A * 11/1998 Tiemeijer et al. ........... 250/305

FOREIGN PATENT DOCUMENTS

EP        555911      1/1999

OTHER PUBLICATIONS

Abstract of JP63231852, "Charged Particle Beam Application Device", of Kuroda Katsuhiro, Application No. 62063758, filed Mar. 20, 1987, published Sep. 27, 1988.

"A double wienfilter as a high resolution, high transmission electron energy analyzer", W. H. J. Anderson et al., *Journal of Physics E: Scientific Instruments*, 1970 vol. 3, pp. 121–126, Printed in Great Britain.

* cited by examiner

Primary Examiner—Bruce Anderson
Assistant Examiner—Zia R. Hashmi
(74) Attorney, Agent, or Firm—Webb Ziesenheim Logsdon Orkin & Hanson, P. C.

(57) ABSTRACT

A monochrometer mounted with the electron gun of an electron microscope or the like. This monochrometer does not need movement of a slit. An electron source consisting of any one of a thermal emission-type electron source (such as an $LaB_6$ electron source or a tungsten hairpin), a Schottky emission-type electron source, and a tunneling field emission-type electron source is used. The slit is made of a single metal plate and mounted in position fixedly. Electrons are emitted from the electron source and dispersed within a plane including the slit according to energies. The slit is so positioned that it passes only those of the dispersed electrons which have energies close to the peak energy and blocks electrons having energies higher or lower than the peak energy.

9 Claims, 9 Drawing Sheets

MONOCHROMETER FOR ELECTRON BEAM

BACKGROUND OF THE INVENTION

1. Field of the Invention

The present invention relates to a monochrometer for selecting only electrons having a certain energy spread from an electron beam having an energy distribution and for causing the selected electrons to hit a specimen and, more particularly, to a monochrometer that can be preferably used within an electron gun.

2. Description of the Related Art

In recent years, field emission guns (FEGs) have had wide acceptance as electron guns for electron microscopes and the like. An FEG is a source having high brightness and emits an electron beam of an energy spread of about 0.3 to 0.7 eV. With this energy spread, however, a desired energy resolution may not be obtained in some kinds of analyses.

For example, in electron energy loss spectroscopy (EELS) where an energy loss that electrons suffered within a specimen is measured to investigate the electron structure of the material, the energy resolution of a spectrometer used to measure the energy loss in the specimen is estimated to be less than 0.1 eV. Where the energy spread of electrons incident on the specimen is about 0.3 to 0.7 eV, the energy resolution for analysis is restricted by the energy spread of the electron beam incident on the specimen. Therefore, a finer energy spectrum cannot be observed.

Accordingly, it is considered that provision of a monochrometer for selecting only a certain energy spread from an energy distribution of an electron beam and for causing the selected electrons to hit a specimen is advantageous. In the prior art monochrometer, however, the monochrometer is inserted in the illumination electron lens system independent of the electron gun.

The following two methods are adopted for the monochrometer inserted in the illumination lens system in this way. In one method, electrons accelerated to a given accelerating voltage are directly passed through the monochrometer. In this case, if the accelerating voltage for the electron beam is increased, the dispersion power of the monochrometer deteriorates. Consequently, it is difficult to obtain an energy resolution of less than 0.2 eV.

In the second method, electrons accelerated up to a desired accelerating voltage are once decelerated and passed through a monochrometer to select only electrons with a desired energy spread. Then, the electrons are again accelerated. In this method, the energy of electrons passed through the monochrometer can be made low. Therefore, high energy dispersion power can be obtained. The energy spread of the electron beam passed through the monochrometer can be reduced to about 10 meV. In this method, however, electrons once accelerated are decelerated and reaccelerated. Where the accelerating voltage is in excess of 200 kV, multistage deceleration and multistage acceleration are necessary. This makes the instrument bulky.

In view of the foregoing circumstances, a third method is conceivable. That is, a monochrometer is mounted within an electron gun. Emitted electrons are passed through the monochrometer before being accelerated to a given accelerating voltage. This is a monochrometer within an electron gun.

In these second and third methods, however, a filter forming the monochrometer or a slit for selecting some energy of electrons must be placed at a high electric potential. Generally, the filter itself has no mechanical movable parts and so it is possible to place the filter at a high electric potential. However, it is difficult to place the slit, which must be mechanically movable, at a high electric potential.

In particular, it is customary to mechanically adjust the position and width of a slit. Therefore, where the slit is placed at a high electric potential, great problems will be produced. Especially, in the third method (i.e., in the case of a monochrometer within an electron gun), it is considered that mechanically adjusting the position and width of a slit at a high electric potential is substantially impossible.

SUMMARY OF THE INVENTION

Accordingly, it is an object of the present invention to provide a monochrometer for use with a slit that does not need to be moved. This can be especially preferably mounted within an electron gun.

To achieve the above-described object, the present invention provides a monochrometer which is mounted within an electron gun and to be used with an electron source for producing an electron beam, the monochrometer comprising: a dispersing filter for dispersing the electron beam according to energies of electrons; and an energy-selecting slit placed in a path of the electron beam dispersed by the dispersing filter. This energy-selecting slit is made of a single slit plate placed to block electrons having energies more than or less than a given energy. For example, the slit plate is a beam-blocking member made of a single metal plate having a straight edge.

In one feature of the invention, the electron source is a thermal emission type electron source, a Schottky emission-type electron source, or a tunneling field emission-type electron source.

In another feature of the invention, the position of the electron beam relative to the energy-selecting slit can be adjusted by controlling power supplies for driving the filter.

The present invention also provides a monochrometer inserted between a specimen and an electron source for producing an electron beam, the monochrometer comprising: a dispersing filter for dispersing the electron beam according to energies of electrons; and an energy-selecting slit placed in a path of the electron beam dispersed by the dispersing filter. This energy-selecting slit is made of a single slit plate placed to block electrons having energies more than or less than a given energy. For example, the slit plate is a beam-blocking member made of a single metal plate having a straight edge.

In a feature of this monochrometer, the electron source is a thermal emission-type electron source, a Schottky emission-type electron source, or a tunneling field emission-type electron source.

In another feature of this monochrometer, the position of the electron beam relative to the energy-selecting slit can be adjusted by controlling power supplies for driving the filter.

Other objects and features of the invention will appear in the course of the description thereof, which follows.

BRIEF DESCRIPTION OF THE DRAWINGS

FIG. 12 is a block diagram of a further monochrometer in accordance with the present invention.

DESCRIPTION OF THE PREFERRED EMBODIMENTS

The concept underlying the present invention is first described while taking a monochrometer mounted within an electron gun as an example. An energy filter is used as the monochrometer placed within the electron gun. Either a Wien filter or an OMEGA filter is preferably used as the energy filter. In any case, an electron beam exiting from the monochrometer is preferably an achromatic electron beam. To realize this, two stages of Wien filters, for example, are used. In particular, the first stage of the Wien filter provides energy dispersion of the electron beam. A slit provides an energy dispersion of the energy-dispersed electron beam. Then, the beam is made to enter the second stage of the Wien filter, where the energy dispersion of the beam caused by the first stage of the Wien filter is returned to zero. In this way, the two stages of the Wien filters are employed, and a slit is placed between them. This is referred to as the double-structure Wien filter.

Where this double-structure Wien filter is used, the electron beam exiting from the filter is essentially the same as the electron beam incident on the filter, if the effects of aberrations are neglected. Consequently, an ideal electron beam that is narrowed only in energy spread can be accomplished. This can also be achieved where an OMEGA filter is used as an energy filter for a monochrometer. Since an OMEGA filter consists of a combination of four sector magnets or electrodes, a slit is placed within the symmetrical plane about which the four sector magnets or electrodes are arranged symmetrically.

Figure 5:
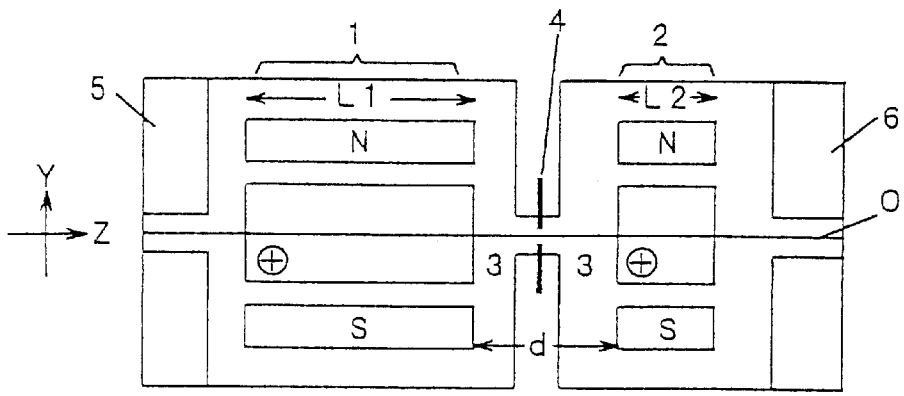
FIG. 5 is a block diagram of one example of a double-structure Wien filter.

Referring to FIG. 5, there is shown an example of the structure of a double-structure Wien filter. This filter assembly is made of a first stage of filter 1 and a second stage of filter 2 arranged along the center orbit O of an electron beam. The length L1 of the first stage of filter 1 is selected to be larger than the length L2 of the second stage of filter 2. A free space 3 of width d exists between the filters 1 and 2. An energy-selecting slit 4 is placed in the electron beam path within this free space 3. Shunt members 5 and 6 are mounted at the entrance and exit, respectively, of the energy filter assembly to prevent electromagnetic fields produced from the first and second stages of filters 1 and 2 from interfering with electromagnetic fields developed by surrounding electron optical elements.

Figure 6:
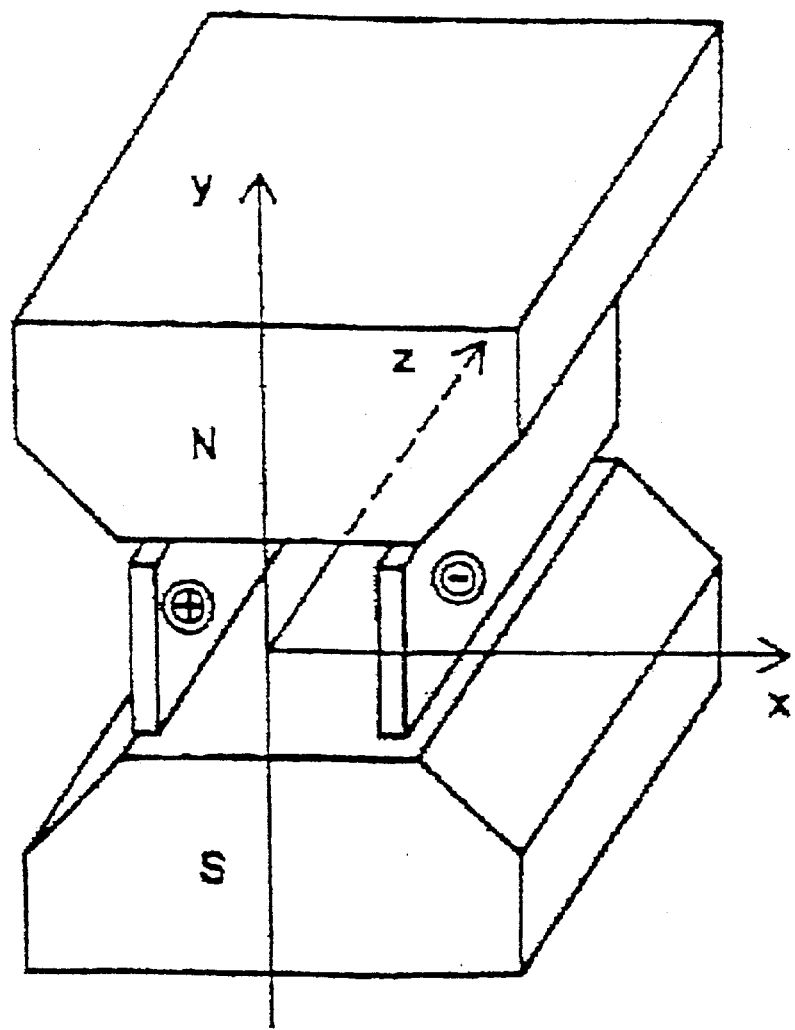
FIG. 6 is a perspective view of one example of a Wien filter.

Each of the first and second stages of filters 1 and 2 is a Wien filter having mutually perpendicular magnetic and electric fields. For example, this Wien filter has a structure shown in FIG. 6, where the optical axis of an electron beam is indicated by Z. Magnetic polepieces N and S are located on the opposite sides of the optical axis. Positive and negative electrodes making a pair are located opposite to each other on the opposite sides of the optical axis within the gap between the magnetic polepieces.

As a result, a magnetic field and an electric field are produced in the Y- and X-directions, respectively, on and around the optical axis. These fields are superimposed on each other. In consequence, electrons entering along the optical axis travel in an orbit determined by a force received from the perpendicular fields and by the energy that the electrons possess.

Figures 7A, 7B:
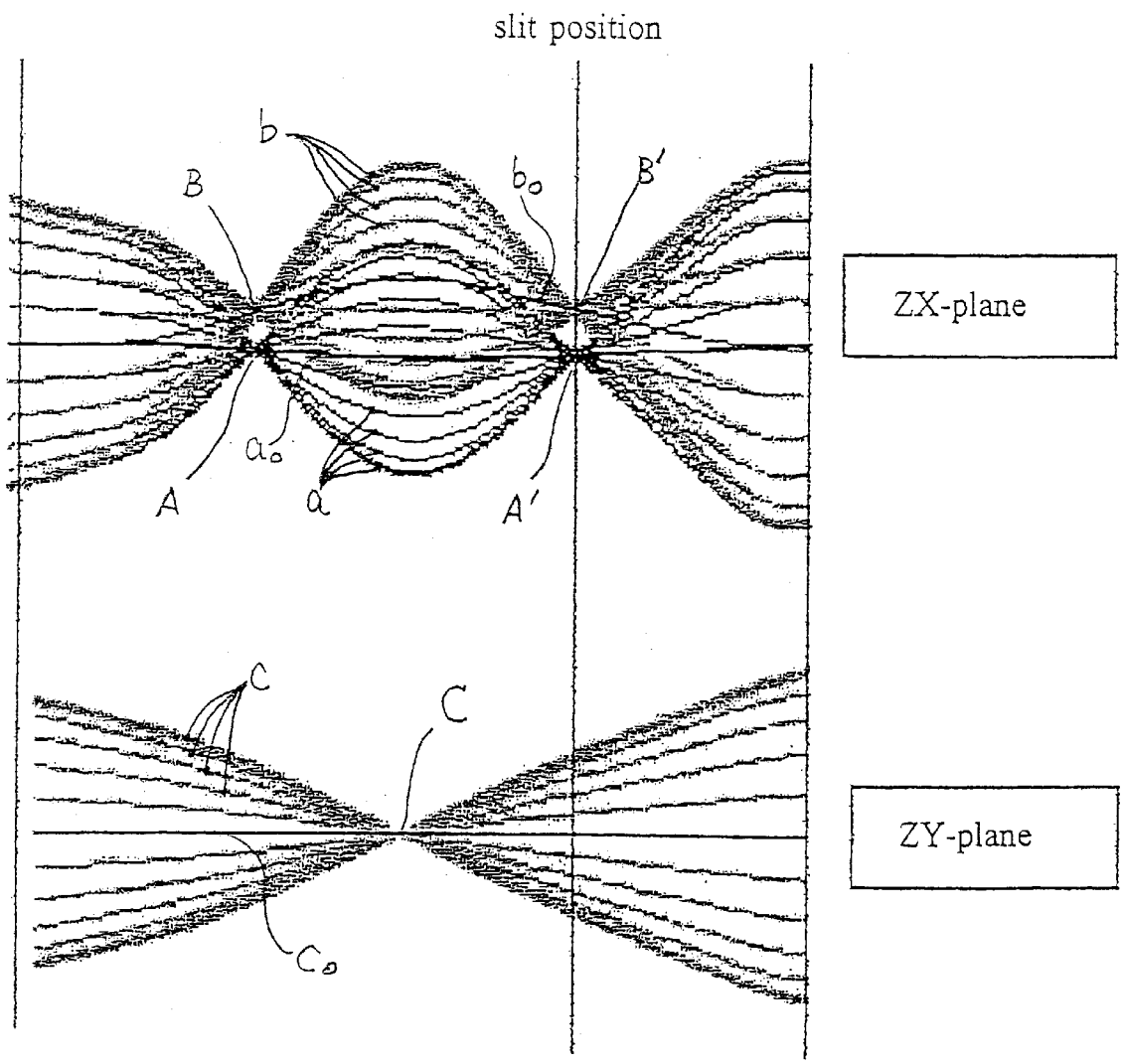
FIGS. 7(a) and 7(b) are diagrams illustrating the orbits of electrons within ZX- and ZY-planes, respectively, within the energy filter shown in FIG. 5.

FIGS. 7(a) and 7(b) illustrate orbits of electrons within the ZX-plane and the ZY-plane in the energy filter shown in FIG. 5. These orbits are results of a computer simulation. In FIGS. 7(a) and 7(b), an electron beam having a circular cross section enters the first stage of filter 1 while converged. The orbit of electrons having the center energy value of the passband of the energy filter and the orbits of electrons having energy values deviating from the center energy value are shown. In the orbit within the ZX-plane of FIG. 7(a), the orbits of the electrons having the center energy value of the passband of the energy filter are indicated by a. The orbits are once converged at position A and then are again converged at position A'. The center orbit of the orbits a is indicated by $a_0$. Similarly, in the diagram of the ZX-plane orbit of FIG. 7(a), orbits b are orbits of electrons having energies deviating from the center energy value. After converted at position B, the orbits are again converged at position B'. The center orbit of the orbits b is indicated by $b_0$.

On the other hand, in the ZY-plane of FIG. 7(b), the orbit of electrons having the center energy value of the passband of the energy filter is identical with the orbit of electrons having energy values deviating from the center energy value. This identical orbit is indicated by c. This orbit c is only once converged at position C near the exit of the first stage of the filter. The orbit exits from the second stage of filter 2 again in the form of a circular cross section. The center of this orbit is indicated by $c_0$.

It can be seen from FIGS. 7(a) and 7(b) that the electron beam assuming a circular cross section on entering the first stage of filter 1 is converged at two positions, i.e., a position close to the center of the first stage of filter 1 and the position of the slit, within the ZX-plane. On the ZY-plane, the orbit is only once converged near the exit of the first stage of the filter and can exit from the second stage of filter 2 again in the form of a circular cross section. In this geometry, convergence is done at different positions in the X- and Y-directions. This can be accomplished by appropriately setting the strengths of the electric and magnetic fields forming the Wien filter.

Figure 8:
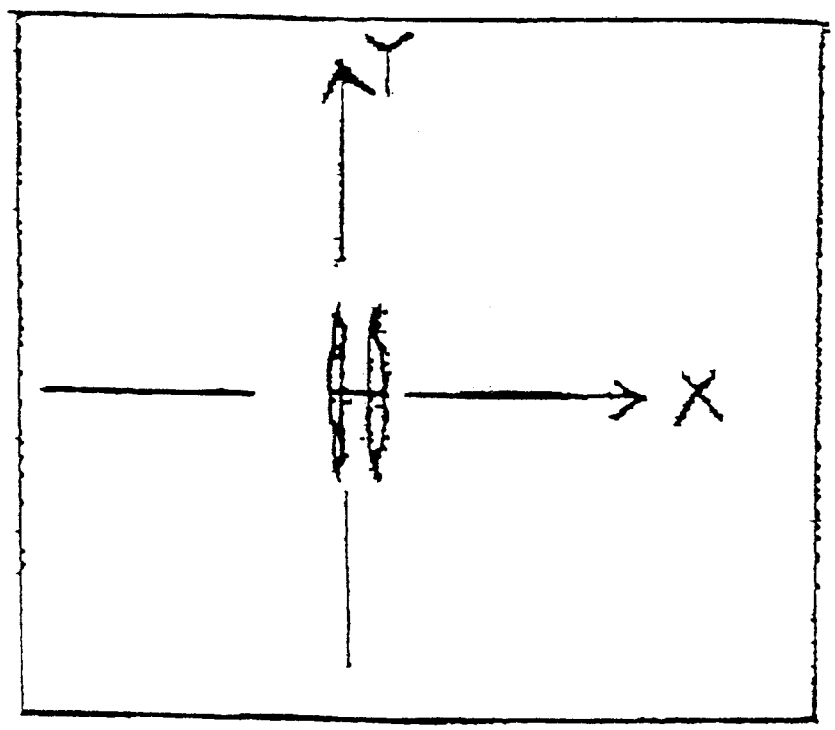
FIG. 8 is a diagram illustrating the profile of an electron beam on the plane of the slit 4 of the energy filter shown in FIG. 5.

FIG. 8 shows the profile of an electron beam in the plane of the slit, i.e., the results of a computer simulation. The electron beam assumes a circular cross section on entering the first stage of filter 1. The beam takes an elliptical or linear cross section having a reduced width in the X-direction and an increased width in the Y-direction. In other words, the beam passes across a different x-coordinate according to a different value of energy. That is, in this case, the electron beam is energy-dispersed in the X-direction. Therefore, only electrons having a desired energy can be passed by means of a slit that is long in the Y-direction and has an appropriate width in the X-direction.

Figure 9:
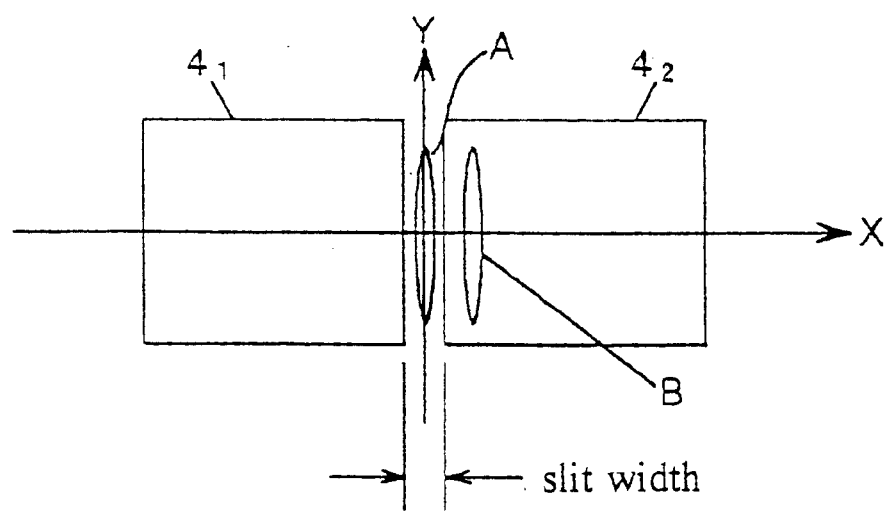
FIG. 9 is a schematic side elevation of the conventional structure of the slit 4 shown in FIG. 5.

This selective passage of electrons (i.e., allowing only electrons having a desired energy to pass through the filter) can be accomplished by fabricating the slit 4 from two metal plates $4_1$ and $4_2$, as shown in FIG. 9 such that these metal plates $4_1$ and $4_2$ can be moved in the X-direction by appropriate means and appropriately adjusting the positions of the metal plates $4_1$ and $4_2$ and the slit width. In FIG. 9, A indicates an electron beam selected by the slit 4 and entering the second stage of filter 2 (not shown in FIG. 9). B indicates an electron beam not selected by the slit 4. As mentioned previously, the electron beam A has a desired energy and is shaped again into a circular cross section by the second stage of filter 2.

We now discuss the Boersch effect (i.e., interaction between charged electrons when they are close to each other) on the electron beam in this structure. Where an electron beam of low energy passes through an energy filter, especially when electrons are traveling close to each other near a focal point within the filter, the electrons are made to interact with each other by this effect. This varies the energies, producing an energy spread. Hence, it is difficult to obtain an electron beam having a narrow energy spread. In this energy filter, the electron beam is focused twice within the ZX-plane and once within the ZY-plane. However, the focal point within the ZX-plane is different from the focal point within the ZY-plane. Therefore, it is unlikely that the beam is focused into a point within the filter. That is, the beam assumes a linear cross-sectional form at each focal point. The electron density is much smaller than in the case in which the beam is focused into a point. Consequently, the Boersch effect can be reduced to a minimum. Accordingly, it is advantageous to use the aforementioned double-structure Wien filter as a monochrometer mounted within an electron gun.

Figure 10:
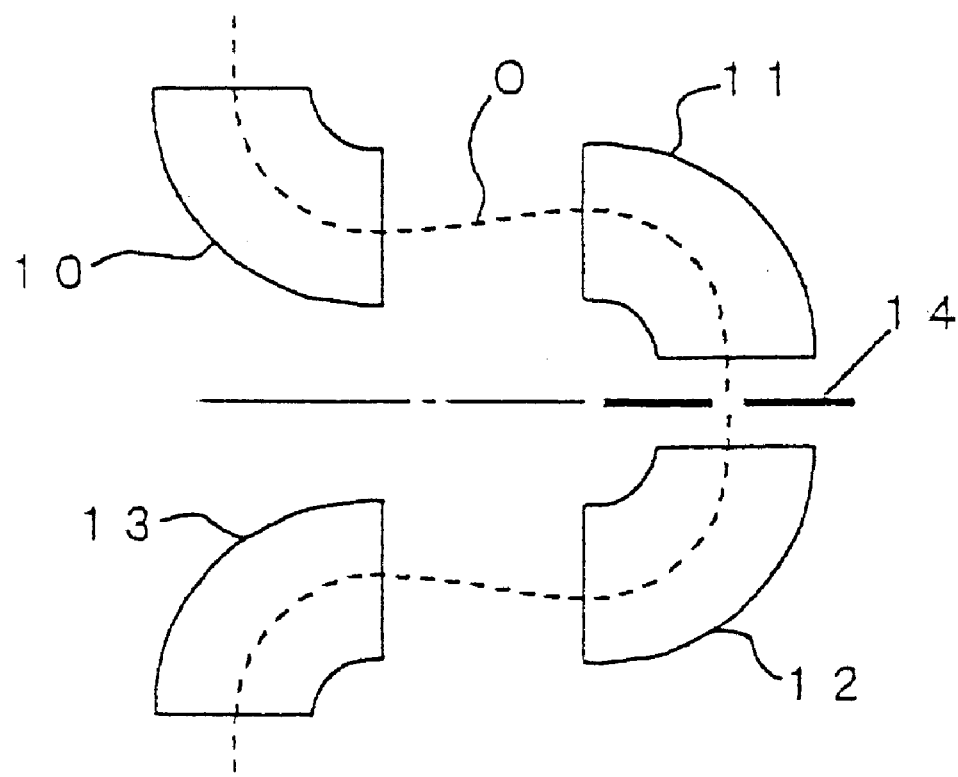
FIG. 10 is a schematic diagram of an OMEGA filter.

While a double-structure Wien filter has been described thus far, an OMEGA filter can also be used advantageously as a monochrometer within an electron gun. An example of the structure of this OMEGA filter is schematically shown in FIG. 10, where there are shown sectors (magnets or electrodes) 10, 11, 12, and 13. The center orbit of an electron beam is indicated by O. The symmetrical plane is indicated by the dot-and-dash line. Specifically, the sectors 10 and 13 are vertically symmetrical with respect to the position indicated by the dot-and-dash line. Similarly, the sectors 11 and 12 are vertically symmetrical with respect to the position indicated by the dot-and-dash line. The sectors 10 and 11 form a first stage of the filter. The sectors 12 and 13 constitute a second stage of the filter.

A slit 14 is positioned at the position of the symmetrical plane indicated by the dot-and-dash line in FIG. 10. Of course, the position and width of the slit 14 are made adjustable. In this way, only electrons having a desired energy can be passed.

Figure 1:
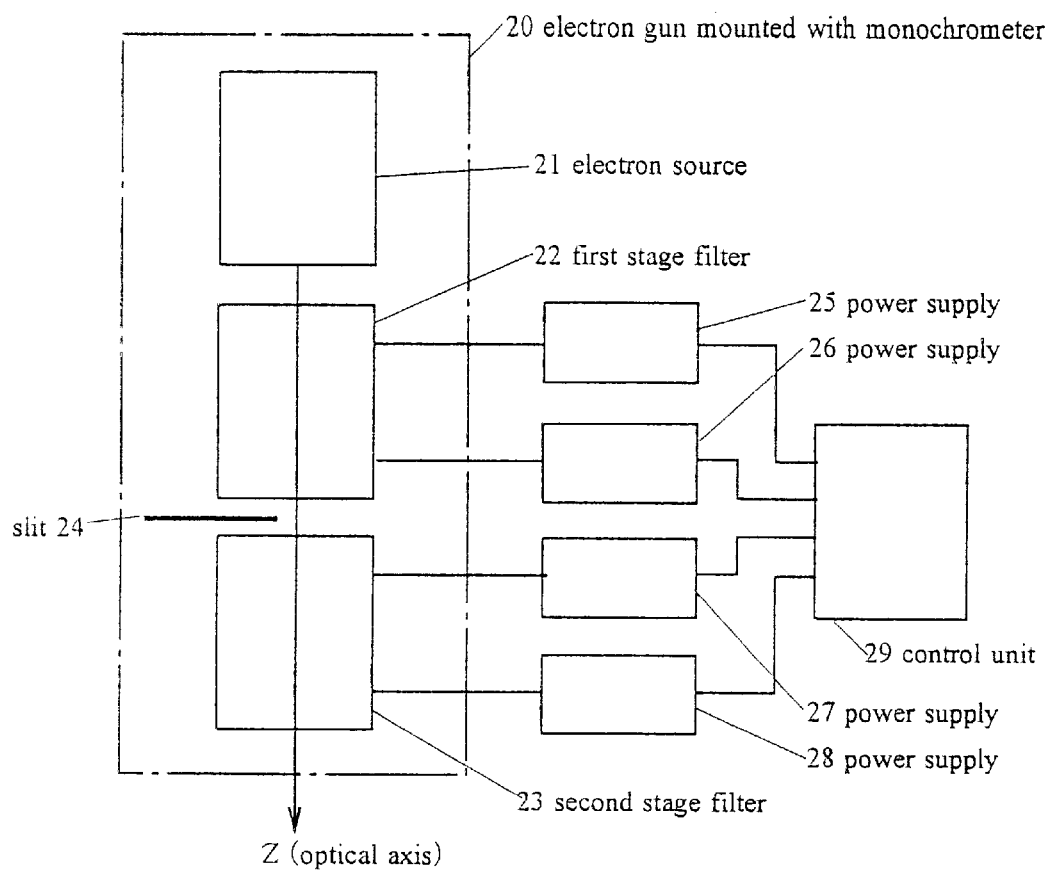
FIG. 1 is a block diagram of a monochrometer built in accordance with the present invention and mounted within an electron gun.

The preferred embodiments of the present invention are described by referring to the accompanying drawings. FIG. 1 shows a monochrometer in accordance with the present invention, the monochrometer being mounted within an electron gun 20. This electron gun 20 has an electron source 21, a first stage of filter 22, and a second stage of filter 23. An energy-selecting slit 24 is inserted between the first stage of filter 22 and the second stage of filter 23. Power supplies 25 and 26 drive the first stage of filter 22. Power supplies 27 and 28 drive the second stage of filter 23. These power supplies 25, 26, 27, and 28 are controlled by a control unit 29.

In the structure shown in FIG. 1, the first stage of filter 22 and the second stage of filter 23 together form a monochrometer. The slit 24 is positioned between the first stage of filter 22 and the second stage of filter 23. This monochrometer may be the aforementioned double-structure Wien filter or OMEGA filter. Where the double-structure Wien filter is used, each of the two stages of filters 22 and 23 is a Wien filter. Where an OMEGA filter is employed, the two stages of filters 22 and 23 are sector magnets or sector electrodes.

Where double-structure Wien filters are used, one of the power supplies 25 and 26 for driving the filter is a current source for supplying an electrical current to a coil (not shown) mounted on the magnet to produce a desired magnetic field between the magnetic polepieces. The other is a voltage source for applying voltages to the electrodes to produce a desired electric field between the electrodes. The power supplies 27 and 28 are designed similarly. Where an OMEGA filter is used, if it is made up of sector magnets, the power supplies 25, 26, 27, and 28 are current sources for supplying electrical currents to coils (not shown) mounted on the magnets to produce a desired magnetic field between the magnetic polepieces. If the OMEGA filter is made up of sector electrodes, the power supplies 25, 26, 27, and 28 are all voltage sources for applying voltages to the electrodes to develop desired electric fields between the electrodes.

The electron source 21 can be any one of a thermal emission-type electron source (such as an $LaB_6$ electron source or a tungsten hairpin), a Schottky emission-type electron source, and a tunneling field emission-type electron source.

The slit 24 is made of one metal plate and mounted fixedly to block passage of electrons on one side of the optical axis. While the slit 24 has been conveniently referred to as a slit, it may be strictly referred to as a beam-blocking member made of a single metal plate having a straight edge. Because of this structure, the desired monochrometer mounted within an electron gun is obtained for the following reason.

Figure 2:
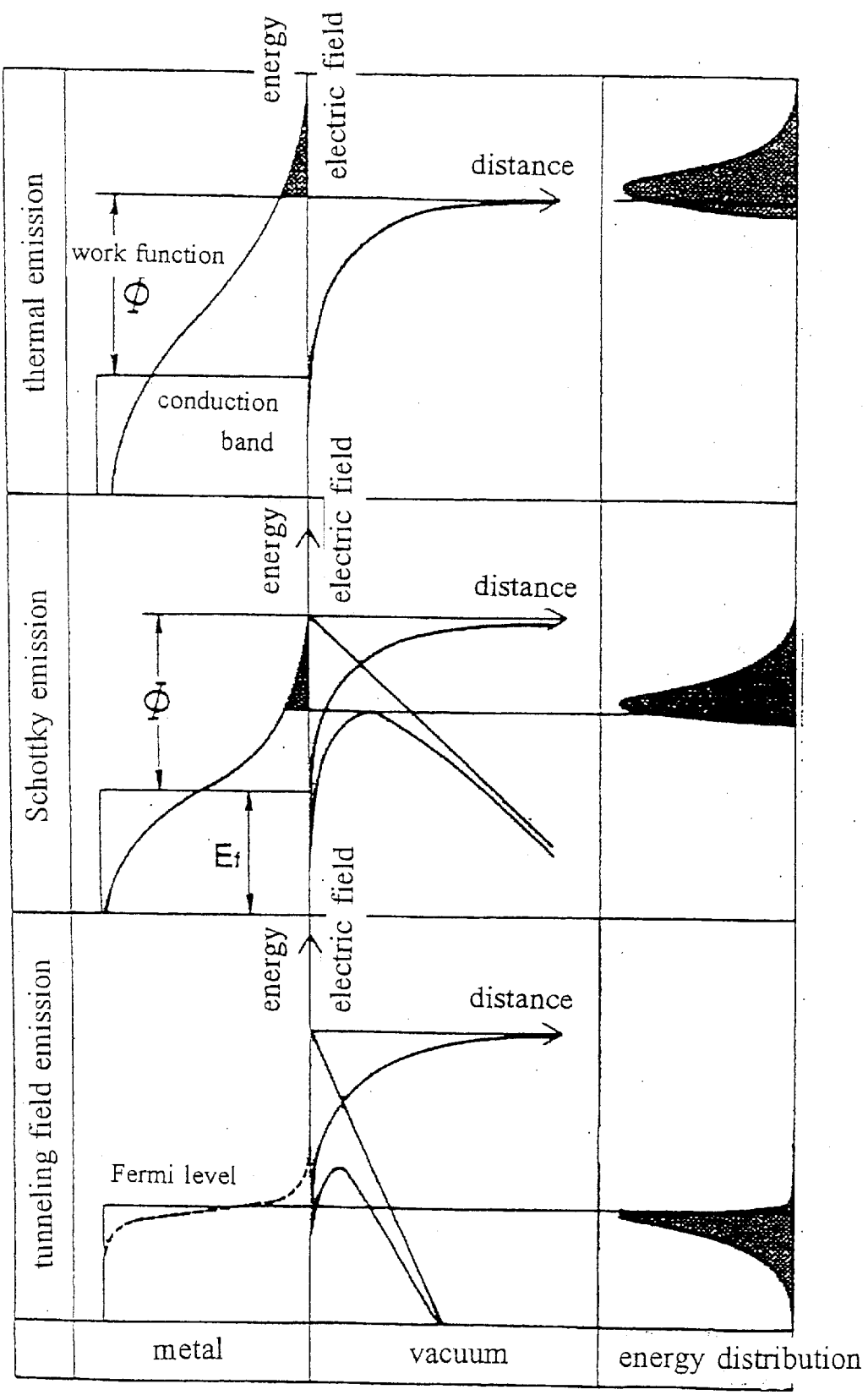
FIG. 2 is a diagram illustrating the energy distributions of electron beams emitted from a thermal emission-type electron source, a Schottky emission-type electron source, and a tunneling field emission-type electron source, respectively.

FIG. 2 illustrates the energy levels of electrons within metals (left portion of FIG. 2) forming three electron sources (i.e., thermal emission-type, Schottky emission-type, and tunneling field emission-type, respectively), the energy levels within a vacuum (center portion) with which the metals are in contact, and the energy distributions of the electron beams (right portion) radiated from the electron sources.

Since the items illustrated in FIG. 2 are well known, they are not described in detail below. It can be seen from the energy distributions of the electron beams from the various electron sources shown in FIG. 2 that every energy distribution curve tails off on only one side from the peak energy position. Note that in the thermal emission-type and the Schottky emission-type, the distribution curve tails off on the higher energy side of the peak position. Conversely, in the tunneling field emission type, the distribution curve tails off on the lower energy side of the peak position.

Accordingly, the electron beam reaching the plane (XY-plane) of the slit 24 after dispersed according to energies by the first stage of filter 22 assumes an elliptical cross section as shown in FIG. 3($a$) where the electron source 21 is of the tunneling field emission type. Where the electron source is of the thermal emission type or Schottky emission type, the beam takes an elliptical cross section as shown in FIG. 3($b$). The black dots in the figures indicate the peak positions of energy.

Figure 3A:
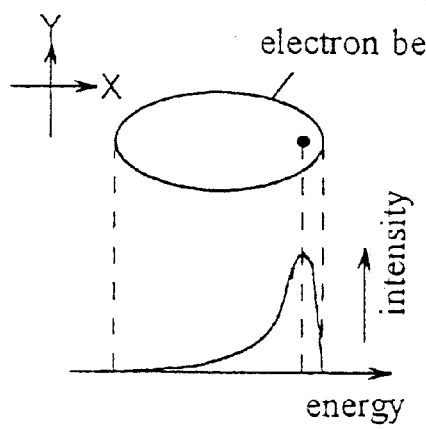
FIGS. 3(a) and 3(b) are diagrams illustrating the profile of an electron beam within the plane of a slit 24 shown in FIG. 1, as well as the energy distribution of the beam.
Figure 3B:
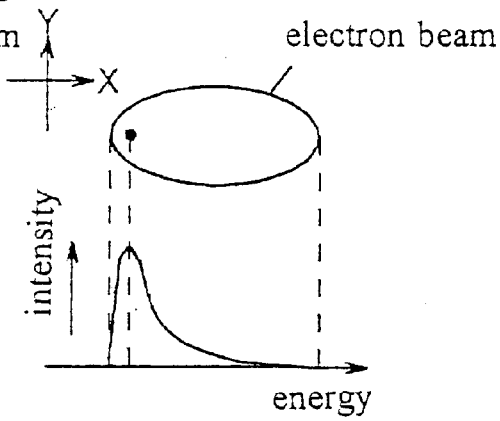

The energy distribution curve of the electron beam is shown below each cross-sectional shape of the beam. It can be observed that in the tunneling field emission type, the electron intensity curve of the electron beam tails off toward the lower-energy side (i.e., to the left in the figure), as shown in FIG. 3(a). However, the intensity curve drops rapidly on the higher-energy side (i.e., to the right). Similarly, in the thermal emission and Schottky emission types, the intensity curve tails off toward the higher-energy side (i.e., to the right) from the peak. The intensity curve drops rapidly on the lower-energy side (to the left), as shown in FIG. 3(b).

A conventional energy filter is shown in FIG. 9 and made of two metal plates to form a slit, for the following reason. Where energy is selected by the energy filter, any arbitrary energy of the dispersed energy is selected using the slit; energies higher and lower than this arbitrary energy are blocked.

On the other hand, in the monochrometer for selectively passing an electron beam which is emitted from an electron source has a distribution as described above, it is not necessary to block electrons having higher and lower energies nor to select electrons having a desired intermediate energy band. That is, to select electrons having the energy at the peak position, only the tailing portion is blocked by a slit piece. Accordingly, in the monochrometer built in accordance with the present invention and mounted within an electron gun, the slit 24 is so positioned that it passes only electrons close to the peak and blocks electrons located on one tailing portion and having energies higher or lower than the peak energy.

Figure 4A:
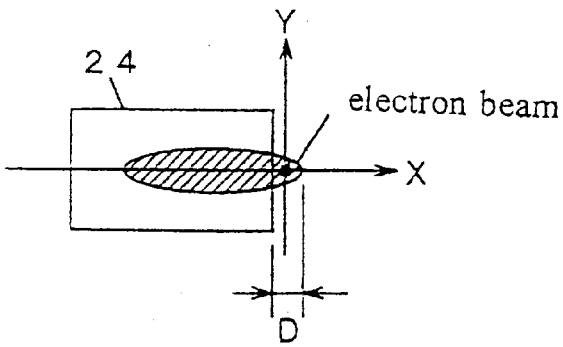
FIGS. 4(a) and 4(b) are diagrams illustrating the positional relation between the electron beam and the slit 24 shown in FIG. 1.
Figure 4B:
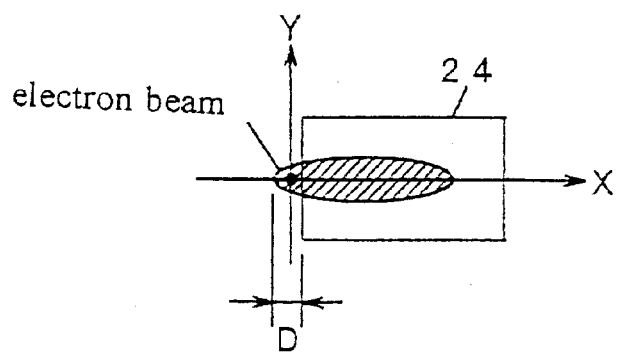

Examples are given in FIGS. 4(a) and 4(b), which show the positional relation between a slit 24 and an electron beam dispersed by a first stage of filter 22 according to energies. FIG. 4(a) shows a case in which the electron source 21 is of the tunneling field emission type. FIG. 4(b) shows a case in which the electron source 21 is of the thermal or Schottky emission type. Electrons are distributed in such a way that the intensity curve tails off from the peak on one side within the plane including the slit 24. Electrons close to the peak are passed, while electrons belonging to the tailing portion are blocked. In this manner, an electron beam having a narrow energy spread can be created. Eventually, D shown in FIGS. 4(a) and 4(b), corresponds to the width of a slit formed by the metal plates $4_1$ and $4_2$ of FIG. 9.

Where the monochrometer is actually used within an electron beam in electron energy loss spectroscopy (EELS), the relation between the slit 24 and the electron beam that is dispersed by the filter 22 according to energies is shown in FIGS. 4(a) and 4(b). When the instrument is adjusted, it is necessary to pass the whole electron beam dispersed by the filter 22 without being obstructed by the slit 24.

Accordingly, when the instrument is adjusted, the electron beam is moved in the positive X-direction in the case of FIG. 4(a). The beam is moved in the negative X-direction in the case of FIG. 4(b). Thus, none of the electrons are blocked by the slit 24. That is, the electron beam is moved in the direction of energy dispersion (X-direction). This can be accomplished by almost every energy filter without adding any special device. For example, where a Wien filter is used, the strength of any one of the magnetic and electric fields is increased or decreased by the power supplies 25, 26, 27, and 28 under control of the control unit 29. In this way, the electron beam is deflected. In an OMEGA filter, if the power supplies 25–28 are controlled under control of the control unit 29, and if sector magnets are used, the electron beam can be moved by slightly varying the currents supplied to the magnets. If sector electrodes are used, the beam can be moved by slightly varying the voltage applied to each sector electrode.

As described thus far, where an analysis is performed by EELS using this monochrometer mounted within an electron gun, of the electron beam from the electron source 21, only electrons close to the peak energy value are passed. Electrons having energies higher or lower than the peak value are blocked by the slit 24. Hence, an electron beam having a narrow energy spread can be obtained. Where it is necessary to pass all electrons emanating from the electron source 21 (e.g., when the instrument is adjusted), the electron beam can be easily shifted to a position at which the beam is not blocked by the slit 24.

The description provided thus far centers on a monochrometer mounted within an electron gun. Of course, this concept can be directly applied to an instrument in which electrons accelerated to a desired accelerating voltage are decelerated, then passed through a monochrometer to select only electrons of a desired energy spread, and then accelerated again.

Figure 11:
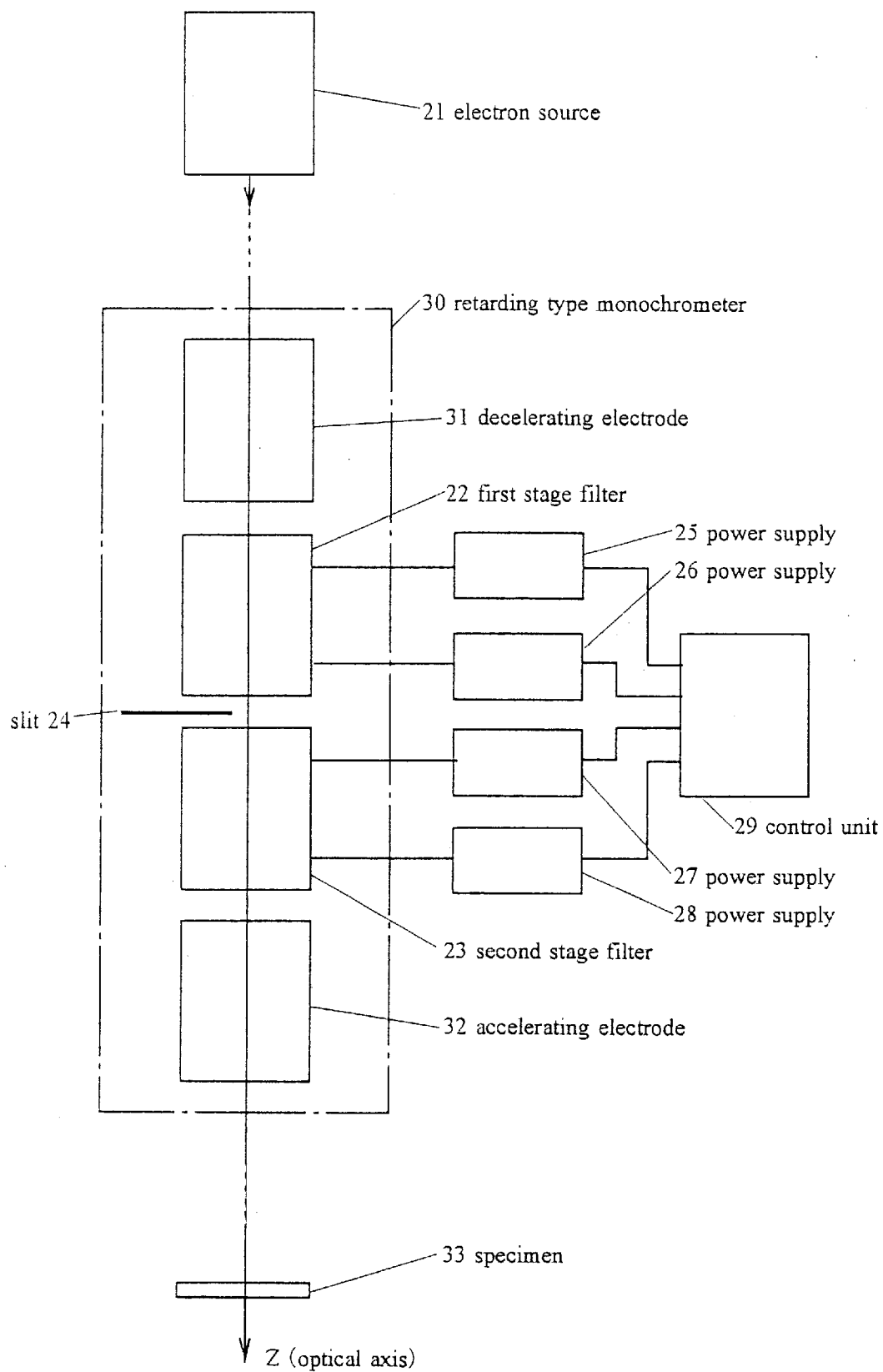
FIG. 11 is a block diagram of another monochrometer in accordance with the present invention.
Figure 1:
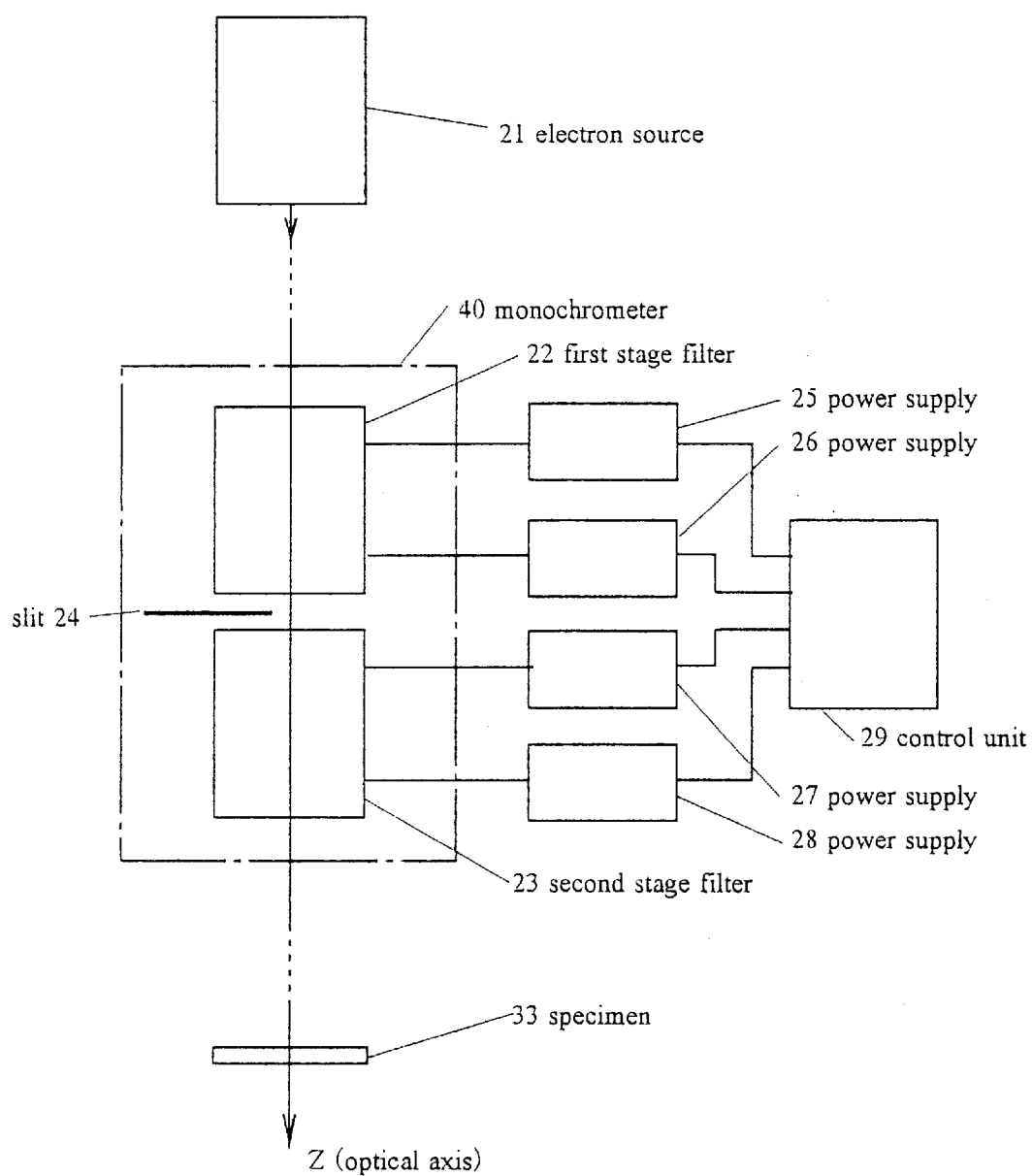

FIG. 11 illustrates an example of such a retarding-type monochrometer. In FIG. 11, the retarding-type monochrometer is indicated by reference numeral 30 and has a decelerating electrode 31 and an accelerating electrode 32. Where the accelerating voltage is high, each of the decelerating electrode 31 and the accelerating electrode 32 has a multistage electrode structure.

Referring still to FIG. 11, the decelerating electrode 31, a first stage of filter 22, a second stage of filter 23, and the accelerating electrode 32 together form the retarding-type monochrometer. A slit 24 is positioned between the first stage of filter 22 and the second stage of filter 23. This monochrometer may be the aforementioned double-structure Wien filter or OMEGA filter. Where a double-structure Wien filter is used, both the first stage of filter 22 and second stage of filter 23 are Wien filters. Where an OMEGA filter is used, the two filters 22 and 23 are sector magnets or sector electrodes.

Where a double-structure Wien filter is used, one of the power supplies 25 and 26 is a current source for supplying an electrical current to a coil (not shown) mounted on a magnet to produce a desired magnetic field between the magnetic polepieces. The other is a voltage source for applying voltages to the electrodes to produce a desired electric field between both electrodes. Power supplies 27 and 28 are designed similarly. Where an OMEGA filter is employed, if it is made up of sector magnets, all of the power supplies 25, 26, 27, and 28 are current sources for supplying currents to coils (not shown) mounted on the magnets to produce a desired magnetic field between the magnetic polepieces. If the filter is made up of sector electrodes, all of the power supplies 25, 26, 27, and 28 are voltage sources for developing desired electric fields between the electrodes.

An electron source placed upstream of this retarding-type monochrometer can be any one of a thermal emission type electron source (such as an $LaB_6$ electron source or a tungsten hairpin), a Schottky emission-type electron source, and a tunneling field emission-type electron source, in the same way as the instrument of FIG. 1.

The slit 24 is made of a single metal plate and mounted fixedly to block passage of an electron beam on one side of the optical axis. While the slit 24 has been conveniently referred to as a slit, it may be strictly referred to as a beam-blocking member made of a single metal plate having a straight edge. Obviously, the retarding-type monochrometer of this construction achieves the same object in the same way as the aforementioned monochrometer mounted within an electron gun.

This concept can also be applied to a monochrometer not of the retarding type. FIG. 12 shows one example of such a monochrometer. In FIG. 12, a monochrometer 40 different from the retarding-type comprises a first stage of filter 22 and a second stage of filter 23. A slit 24 is positioned between the first stage of filter 22 and the second stage of filter 23. This monochrometer can be either the aforementioned double-structure Wien filter or OMEGA filter. Where a double-structure Wien filter is employed, both the first stage of filter 22 and the second stage of filter 23 are Wien filters. Where an OMEGA filter is used, the two filters 22 and 23 are sector magnets or sector electrodes.

Where a double-structure Wien filter is used, one of the power supplies 25 and 26 is a current source for supplying an electrical current to a coil (not shown) mounted on a magnet to produce a desired magnetic field between the magnetic polepieces. The other is a voltage source for applying voltages to the electrodes to produce a desired electric field between both electrodes. Power supplies 27 and 28 are designed similarly. Where an OMEGA filter is employed, if it is made up of sector magnets, all of the power supplies 25, 26, 27, and 28 are current sources for supplying currents to coils (not shown) mounted on the magnets to produce a desired magnetic field between the magnetic polepieces. If the filter is made up sector electrodes, all of the power supplies 25, 26, 27, and 28 are voltage sources for developing desired electric fields between the electrodes.

An electron source placed upstream of this monochrometer can be any one of a thermal emission-type electron source (such as an $LaB_6$ electron source or a tungsten hairpin), a Schottky emission-type electron source, and a tunneling field emission-type electron source, in the same way as the instrument of FIG. 1.

The slit 24 is made of a single metal plate and mounted fixedly to block passage of an electron beam on one side of the optical axis. While the slit 24 has been conveniently referred to as a slit, it may be strictly referred to as a beam-blocking member made of a single metal plate having a straight edge. Obviously, the monochrometer of this construction achieves the aforementioned object (i.e., it is not necessary to mechanically move the slit) in the same way as the aforementioned monochrometer mounted within an electron gun.

Having thus described my invention with the detail and particularity required by the Patent Laws, what is desired protected by Letters Patent is set forth in the following claims.

What is claimed is:

1. A monochrometer mounted within an electron gun and to be used with an electron source for producing an electron beam, said monochrometer comprising:
   a dispersing filter for dispersing the electron beam along one direction perpendicular to the beam path according to energies of electrons, said dispersed electron beam having electron orbits focussed at a focus position;
   an energy-selecting blocking member placed in a path of the electron beam dispersed by said dispersing filter, said energy-selecting blocking member being made of a single plate placed to block electrons having energies more than or less than a given energy, said beam-blocking member made of a single metal plate having a straight edge, said plate placed fixedly at said focus position so that the straight edge is substantially perpendicular to said dispersion direction and said orbits; and
   a control and power supply for controlling said dispersing filter, said control and power supply adjusting said electron orbits so that energies of electrons passed may be varied.

2. A monochrometer mounted within an electron gun as set forth in claim 1, wherein:
   (A) said electron source is a thermal emission-type electron source or a Schottky emission-type electron source;
   (B) said energy-selecting blocking member is made of a single plate placed to block electrons having energies more than a given energy, said plate being made of a single metal plate having a straight edge; and
   (C) said energy-selecting blocking member arranged to pass a peak portion of distribution of electrons dispersed according to energies by said dispersing filter.

3. A monochrometer mounted within an electron gun as set forth in claim 1, wherein:
   (A) said electron source is a tunneling emission-type electron source;
   (B) said energy-selecting blocking member is made of a single plate placed to block electrons having energies less than a given energy, said plate being made of a single metal plate having a straight edge; and
   (C) said energy-selecting blocking member arranged to pass a peak portion of distribution of electrons dispersed according to energies by said dispersing filter.

4. A monochrometer mounted within an electron gun as set forth in any one of claims 1–3, wherein said control and power supplies adjustably position the electron beam relative to said energy-selecting blocking member.

5. A monochrometer mounted within an electron gun as set forth in any one of claims 1–3, comprising a second filter for reversing the dispersion of the dispersing filter.

6. A monochrometer inserted between a specimen and an electron source for producing an electron beam, said monochrometer comprising:
   a dispersing filter for dispersing the electron beam along one direction perpendicular to the beam path according to energies of electrons, said dispersed electron beam having electron orbits focussed at a focus position;
   an energy-selecting blocking member placed in a path of the electron beam dispersed by said dispersing filter, said energy-selecting blocking member being made of a single plate placed to block electrons having energies more than or less than a given energy, said beam-blocking member made of a single metal plate having a straight edge, said plate placed fixedly at said focus position so that the straight edge is substantially perpendicular to said dispersion direction and said orbits; and
   a control and power supply for controlling said dispersing filter, said control and power supply adjusting said electron orbits so that energies of electrons passed may be varied.

7. A monochrometer inserted between a specimen and an electron source in claim 6, wherein:
   (A) said electron source is a thermal emission-type electron source or a Schottky emission-type electron source;
   (B) said energy-selecting blocking member is made of a single plate placed to block electrons having energies more than a given energy, said plate being made of a single metal plate having a straight edge; and
   (C) said energy-selecting blocking member arranged to pass a peak portion of distribution of electrons dispersed according to energies by said dispersing filter.

8. A monochrometer inserted between a specimen and an electron source in claim 6, wherein:

(A) said electron source is a tunneling emission-type electron source;

(B) said energy-selecting blocking member is made of a single plate placed to block electrons having energies less than a given energy, said plate being made of a single metal plate having a straight edge; and (C) said energy-selecting blocking member arranged to pass a peak portion of distribution of electrons dispersed according to energies by said dispersing filter.

9. A monochrometer inserted between a specimen and an electron source in any one of claims 6–8, wherein said control and power supplies adjustably position the electron beam relative to said energy-selecting blocking member.

* * * * *